United States Patent [19]
Kubota et al.

[11] Patent Number: 5,475,918
[45] Date of Patent: Dec. 19, 1995

[54] METHOD OF PREVENTING DEFORMATION OF LEAD FRAMES

[75] Inventors: Tsuneo Kubota; Kazuhiro Taniguchi, both of Hiratsuka, Japan

[73] Assignee: Electroplating Engineers of Japan Ltd., Tokyo, Japan

[21] Appl. No.: 307,006

[22] Filed: Sep. 16, 1994

[30] Foreign Application Priority Data

Oct. 1, 1993 [JP] Japan ................................. 5-246704
Oct. 29, 1993 [JP] Japan ................................. 5-271430

[51] Int. Cl.⁶ ........................... H01L 21/48; C25D 5/02
[52] U.S. Cl. .................. 29/827; 29/856; 29/DIG. 12; 257/676; 361/813
[58] Field of Search .............................. 29/827, DIG. 12, 29/856, DIG. 29; 156/666.1; 205/122, 125; 257/676, 674, 668; 361/813; 427/98, 208, 2; 437/209, 220

[56] References Cited

U.S. PATENT DOCUMENTS

| | | | |
|---|---|---|---|
| 4,033,844 | 7/1977 | Pantiga et al. | 205/125 X |
| 4,089,733 | 5/1978 | Zimmerman | 29/827 X |
| 4,835,120 | 5/1989 | Mallik et al. | 437/209 |
| 4,894,752 | 1/1990 | Murata et al. | 257/676 X |
| 5,227,662 | 7/1993 | Ohno et al. | 257/676 |

FOREIGN PATENT DOCUMENTS

| | | | |
|---|---|---|---|
| 60-105658 | 7/1985 | Japan | 29/827 |
| 2-156547 | 6/1990 | Japan | 29/827 |
| 3-035589 | 2/1991 | Japan | 29/DIG. 12 |

Primary Examiner—Peter Vo
Attorney, Agent, or Firm—Michael D. Bednarek; Marks & Murase

[57] ABSTRACT

Based on the fact that those portions of a lead frame which are liable to undergo deformation are the to-be-nonplated portions, the to-be-nonplated portions defined around the to-be-plated portions are covered with an adhesive tape or a resin film before the lead frame is subjected to a plating treatment, whereby to prevent deformation of the lead frame from the stage preceding to the surface treating step.

10 Claims, 1 Drawing Sheet

METHOD OF PREVENTING DEFORMATION OF LEAD FRAMES

BACKGROUND OF THE INVENTION

1. Detailed Description of the Invention

The present invention relates to a method of preventing deformation of a lead frame during a plating process.

2. Description of the Prior Art

The lead frame has to-be-plated portions including die pads on which the pin tips and chips are mounted, and these portions are plated with a noble metal etc. After the lead frame is subjected to surface treating process, mainly the plating treatment, it is subjected to assembly process including wire bonding, resin molding, etc. to be finally fabricated into electronic package parts.

The treatments to be applied to the lead frames in the respective processes are carried out as follows. A plurality of lead frames are forwarded at one time on a mechanical transfer line employing a roller mechanism or a chucking mechanism, and they are automatically treated by a plating unit (see, e.g., Japanese Unexamined Utility Model Publication No. 60-105658) and an assembly unit arranged on the mechanical transfer line.

Recently, there is a tendency toward thinner and multi-pin structure lead frames, so that the lead frames are liable to undergo deformation during travelling on the mechanical transfer line. Accordingly, the molding areas excluding the to-be-plated portions are provided with adhesive tapes or resin films to cover the area after completion of the surface treating process so as to prevent such deformation of the lead frames.

SUMMARY OF THE INVENTION

However, since adhesive tapes or resin films are applied to cover the lead frames after completion of the surface treating process in such prior art, possible deformation of the lead frame can be prevented in the process subsequent to the surface treatment, but it is impossible to prevent such deformation in the surface treating process before the adhesive tapes or resin films are applied.

The present invention was accomplished noting the prior art described above and is directed to provide a method of preventing deformation of a lead frame from the stage previous to the surface treating process.

In order to attain the above object, in the method of preventing deformation of a lead frame according to the present invention, to-be-nonplated portions of the laed frame are covered befeorehand with an adhesive tape or a resin film, and then a plating treatment is applied to the to-be-plated portions of the lead frame.

More specifically, according to the present invention, since predetermined portions of the lead frame are covered with an adhesive tape or a resin film before the lead frame is subjected to a plating treatment, possible deformation of the lead frame can be prevented from the stage of surface treating step. Further, since only the to-be-nonplated portions of the lead frame are covered with the adhesive tape or resin film to allow the to-be-plated portions thereof to be exposed, the adhesive tape or resin film serves as the mask for the lead frame, enabling high accuracy plating treatment of the to-be-plated portions only.

To give more detailed description, in order to attain the intended object described above, the method of preventing deformation of a lead frame according to the present invention comprises providing to-be-nonplated portions around the to-be-plated portions of the lead frame; applying adhesive tapes or resin films to cover the to-be-nonplated portions, said tapes or films has openings respectively which are at least equal to or larger than the to-be-plated portions; and plating the to-be-plated portions of the lead frame.

To give other detailed description, according to the present invention, since a lead frame is subjected to plating treatment after adhesive tapes or resin films are applied to cover the to-be-nonplated portions of the lead frame, possible deformation of the lead frame can be prevented from the stage of the surface treating process. Since the adhesive tapes or resin films are applied within the to-be-nonplated portions, respectively, they never hinder the subsequent plating treatment.

Meanwhile, if the openings of the adhesive tapes or resin films are allowed to have the same shape as that of the to-be-plated portions of the lead frame, respectively, and if they are applied onto the lead frame under registration of the openings with the corresponding to-be-plated portions, the adhesive tapes or resin films serve as the masks for the lead frame, enabling high accuracy plating against the to-be-plated portions only. When the masking property of the adhesive tape is compared with that of the resin film, the resin film is superior in that it can cover the side faces (the faces corresponding to the thickness of the lead frame) in the notches of the lead frame can be covered thereby. Meanwhile, when the covering techniques of the two are compared, the adhesive tape is superior and convenient in that it can be applied merely by bonding.

Other objects, features and advantages of the present invention will become more apparent from the following description taken in connection with the accompanying drawing. It is to be understood that the following embodiments are illustrative and not limitative, and changes and variations may be made therein without departing from the scope and spirit of the invention.

DETAILED DESCRIPTION OF THE PREFERRED EMBODIMENTS

Figure 1:
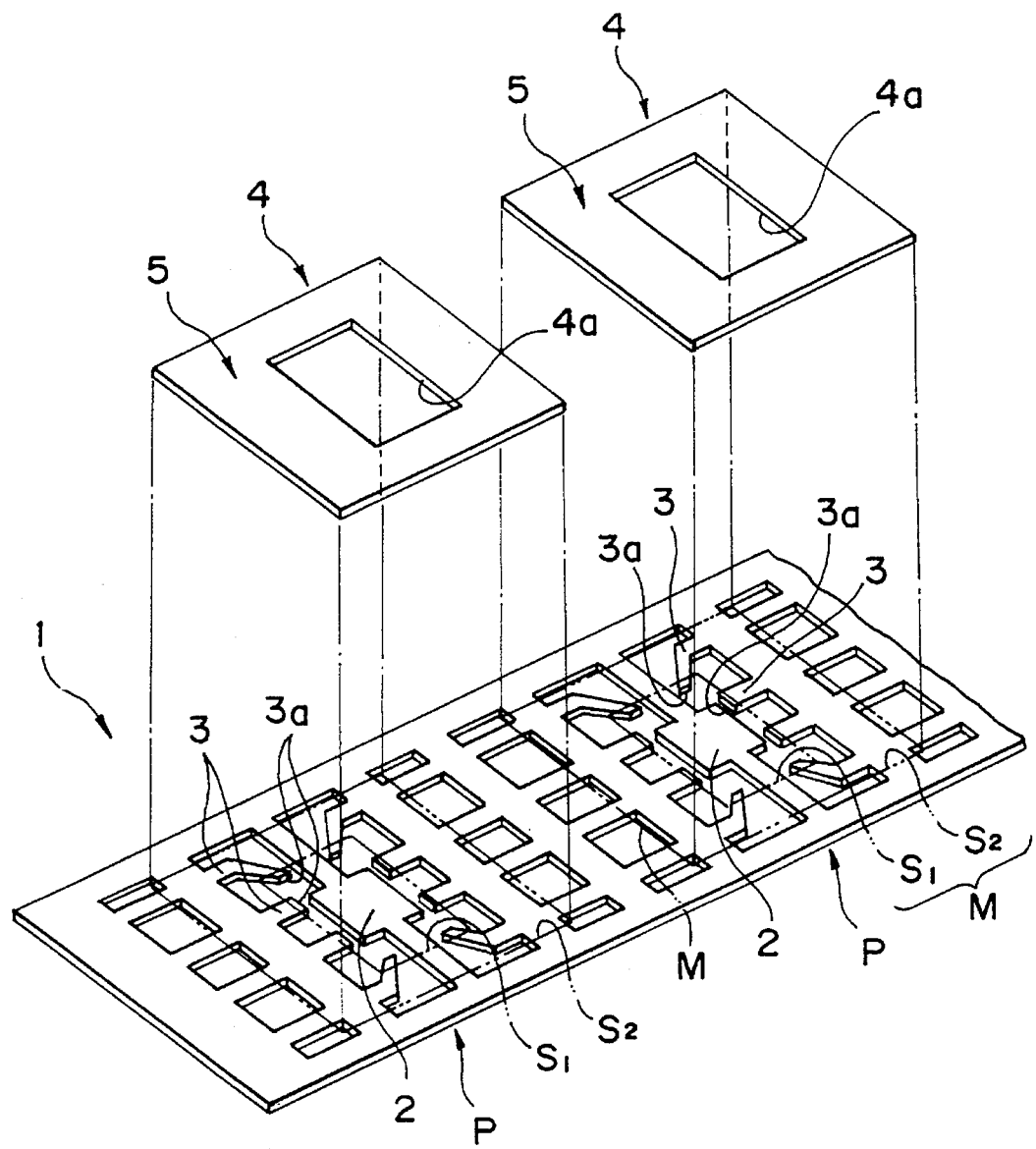
FIG. 1 shows in perspective view a lead frame according to one embodiment of the invention.

One preferred embodiment of the present invention will now be described referring to the attached drawing. In the description of this embodiment, for example, adhesive tapes are employed. The reference number 1 denotes a lead frame having a recurring pattern P formed continuously in the longitudinal direction. In the lead frame 1, each portion where one pattern P is formed is to constitute one electronic package part and provided with a die pad 2 and a plurality of pins 3, with the tips 3a of which being in the proximity of the die pad 2. The area including the die pad 2 and the tips 3a of the pins 3 is assumed to be a to-be-plated portion $S_1$. M denotes a molding area which is to be finally subjected to resin molding. The portion excluding the to-be-plated portion $S_1$ within the molding area M is set aside as the to-be-nonplated portion $S_2$.

A polyimide adhesive tape 4 which is of a heat-resistant resin is applied preliminarily to each portion where a pattern P is formed in the lead frame 1. An opening 4a having the same shape as that of the to-be-plated portion $S_1$ is defined in the adhesive tape 4. Accordingly, the shape of the adhesive tape 4 as a whole is just the same as that of the to-be-nonplated portion $S_1$, and the tape 4 can be bonded to the to-be-nonplated portion $S_2$ with the aid of the adhesive material applied on the lower surface of tape 4. Thus, by bonding the adhesive tape 4, only the to-be-plated portion $S_1$ is exposed within the molding area M of the lead frame 1, and the rest of the portion is masked by the adhesive tape 4.

The adhesive tapes 4 are bonded preliminarily to the lead frame 1 at the stage prior to the surface treating process where the lead frame 1 is subjected to plating treatment. In other words, the lead frame 1 with adhesive tapes 4 bonded thereto is forwarded as such on a transfer line, and plated (with a noble metal such as gold) by an automatic plating unit provided on the transfer line. Since the adhesive tapes 4 are bonded to the lead frame 1, the lead frame 1 is prevented from undergoing deformation during travelling on the transfer line and during the plating treatment by the automatic plating unit. Namely, the pins 3 very susceptible to deformation are immobilized by the adhesive tapes 4, so that it never happens that the pins 3 undergo deformation to change the pin-to-pin distances.

When the to-be-plated portions $S_1$ of the lead frame 1 is to be plated by the automatic plating unit, since the to-be-nonplated portions $S_2$ of the lead frame 1 are preliminarily masked by the adhesive tapes 4, accurate plating can be carried out even if the masking member in the automatic plating unit does not have very high accuracy. The adhesive tapes 4 remain as bonded onto the lead frame 1 even in the assembly process subsequent to the surface treating process, any possible deformation of the lead frame 1 in the assembly process can also be prevented. Incidentally, the plating solution to be employed in the automatic plating unit is preferably of a composition which does not substantially affect the adhesive material of the adhesive tape 4, such as a noncyan plating solution.

The adhesive tapes 4 bonded to the lead frame 1 are finally embedded together with the molding areas M of the lead frame 1 in resin moldings. Since the adhesive tapes 4 are of heat-resistant polyimide resin, they can stand the high temperature to be applied during resin molding. The above embedding procedure effectively eliminates a process of removing the adhesive tapes 4.

Incidentally, while the adhesive tapes 4 are each provided with an opening 4a having the same shape as that of the to-be-plated portion $S_1$ in the embodiment described above, possible deformation of the lead frame 1 can also be prevented by using adhesive tapes having openings which are larger than the to-be-plated portions $S_1$. However, in the latter case, the adhesive tapes cannot exhibit the masking effect of exposing the to-be-plated portions $S_1$ only.

In the embodiment described above, while adhesive tapes 4 were applied to the to-be-nonplated portions $S_2$ of the lead frame 1, the to-be-nonplated portions $S_2$ of the lead frame 1 may otherwise be coated preliminarily by resin films such as of a polyimide.

The method of preventing deformation of a lead frame according to the present invention is of the constitution as described above, and adhesive tapes or resin films are applied to cover the to-be-nonplated portions of the lead frame before the lead frame is subjected to plating treatment, so that the lead frame can be prevented from undergoing deformation from the stage of the surface treating process.

Further, if the openings of the adhesive tapes or resin films are allowed to have the same shape as that of the to-be-plated portions of the lead frame, respectively, and if they are applied onto the lead frame under registration of the openings with the corresponding to-be-plated portions, the adhesive tapes or resin films serve as the masks for the lead frame, enabling high accuracy plating against the to-be-plated portions only. Accordingly, the masking member in the plating unit need not be so accurate, and thus the plating unit can be simplified.

What is claimed is:

1. A method of preventing deformation of a lead frame, which comprises:

defining, on a lead frame, to-be-nonplated portions around to-be-plated portions respectively, said to be plated portions including pin tips and die pads on which chips are to be mounted;

providing, on an adhesive tape or a resin film to be applied to said lead frame, covering surface portions corresponding to profile of said to-be-nonplated portions of said lead frame, and openings which locate in said covering surface portions corresponding to a profile of said to-be-plated portions of said lead frame, respectively; and applying said adhesive tape or resin film to said lead frame prior to plating treatment, followed by a plating treatment of said to-be-plated portions exposed through said opening.

2. The method of preventing deformation of a lead frame according to claim 1, wherein the shape of said openings of said adhesive tape or resin film is the same as that of said to-be-plated portions of said lead frame; said adhesive tape or resin film being applied to said lead frame with said openings registered with said to-be-plated portions of said lead frame respectively so as to cover said to-be-nonplated portions defined around said to-be-plated portions.

3. The method of preventing deformation of a lead frame according to claim 2, wherein said adhesive tape or resin film is formed by a heat-resistant resin, which is not peeled after completion of said plating treatment but embedded in a resin molding when said lead frame is subjected to a resin molding treatment.

4. The method of preventing deformation of a lead frame according to claim 3, wherein said heat-resistant resin is a polyimide.

5. The method of preventing deformation of a lead frame according to claim 2, wherein said adhesive tape or resin film is formed by a heat-resistant resin, which is not peeled after completion of said plating treatment but embedded in a resin molding when said lead frame is subjected to a resin molding treatment.

6. The method of preventing deformation of a lead frame according to claim 5, wherein said heat-resistant resin is a polyimide.

7. A method of preventing deformation of a lead frame, which comprises:

covering to-be-nonplated portions of a lead frame beforehand with an adhesive tape or a resin film; and applying a plating treatment to to-be-plated portions of said lead frame;

wherein said adhesive tape or resin film is formed by a heat-resistant resin, which is not peeled after completion of said plating treatment but embedded in a resin molding when said lead frame is subjected to a resin molding treatment.

8. The method of preventing deformation of a lead frame according to claim 7, wherein said heat-resistant resin is a polyimide.

9. A method of preventing deformation of a lead frame, wherein said lead frame is prevented from being deformed in a series of treatment processes from plating treatment to resin molding provided on said lead frame having die pads, to-be-plated portions, and to-be-nonplated portions, said to-be-plated portions including pin tips which are located around said die pads, said to-be-nonplated portions being located around said to-be-plated portions, said method comprising the steps of:

applying a heat-resistant adhesive tape or resin film onto said lead frame prior to plating treatment, said adhesive tape or resin film having covering surface portions corresponding to the profile of said to-be-nonplated portions, and openings corresponding to the profile of said to-be-plated portions, to thereby allow said to-be-plated portions to be exposed through said openings and to provide said lead frame with a state that said to-be-nonplated portions are covered with said covering surface portions; and providing the lead frame with said series of treatment processes from plating treatment to resin molding, said resin molding having said adhesive tape or resin film embedded therein when said lead frame is subjected to a resin molding treatment.

10. The method of preventing deformation of a lead frame according to claim 9, wherein said resin film is formed of polyimide.

* * * * *